United States Patent
Di Mola et al.

(10) Patent No.: US 11,159,238 B1
(45) Date of Patent: Oct. 26, 2021

(54) EXTERNAL LASER ENABLED CO-PACKAGED OPTICS ARCHITECTURES

(71) Applicant: Juniper Networks, Inc., Sunnyvale, CA (US)

(72) Inventors: Domenico Di Mola, Morgan Hill, CA (US); Steven B. Alleston, Los Gatos, CA (US); Zhen Qu, Sunnyvale, CA (US); Ryan Holmes, Nepean (CA); Jeffery J. Maki, Dublin, CA (US); Chul Soo Park, Dublin, CA (US); Yang Yue, Milpitas, CA (US); Jon J. Anderson, San Jose, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 0 days.

(21) Appl. No.: 16/990,348

(22) Filed: Aug. 11, 2020

(51) Int. Cl.
*H04B 10/2581* (2013.01)
*H01S 5/40* (2006.01)
*G02B 6/42* (2006.01)
*H04B 10/60* (2013.01)
*H04B 10/50* (2013.01)
(Continued)

(52) U.S. Cl.
CPC ......... *H04B 10/2581* (2013.01); *G02B 6/425* (2013.01); *H01S 5/4062* (2013.01); *H04B 10/40* (2013.01); *H04B 10/503* (2013.01); *H04B 10/5161* (2013.01); *H04B 10/60* (2013.01); *H04J 14/04* (2013.01)

(58) Field of Classification Search
None
See application file for complete search history.

(56) References Cited

U.S. PATENT DOCUMENTS

| 10,284,323 | B2 | 5/2019 | Salsi | |
| 10,330,875 | B2 * | 6/2019 | Fini | G02B 6/43 |

(Continued)

FOREIGN PATENT DOCUMENTS

EP 2903191 A1 * 8/2015 ............ H04J 14/02

OTHER PUBLICATIONS

Thorlabs, Single Frequency Lasers Tutorial, 2016 (Year: 2016).*

(Continued)

*Primary Examiner* — Jai M Lee
(74) *Attorney, Agent, or Firm* — Schwegman Lundberg & Woessner, P.A.

(57) ABSTRACT

A sourceless co-packaged optical-electrical chip can include a plurality of different optical transceivers, each of which can transmit to an external destination or internal components. Each of the transceivers can be configured for a different modulation format, such as different pulse amplitude, phase shift key, and quadrature amplitude modulation formats. Different light sources provide light for processing by the transceivers, where the light source and transceivers can be configured for different applications (e.g., different distances) and data rates. An optical coupler can combine the light for the different transceivers for input into the sourceless co-packaged optical-electrical chip via a polarization maintaining media (e.g., polarization maintaining few mode fiber and polarization maintaining single mode fiber), where another coupler operates in splitting mode to separate the different channels of light for the different transceivers according to different co-packaged configurations.

20 Claims, 7 Drawing Sheets

(51) Int. Cl.
    *H04B 10/516*    (2013.01)
    *H04B 10/40*    (2013.01)
    *H04J 14/04*    (2006.01)

(56) References Cited

U.S. PATENT DOCUMENTS

| | | | | |
|---|---|---|---|---|
| 10,578,799 | B2* | 3/2020 | Doerr | G02B 6/4269 |
| 10,763,968 | B1* | 9/2020 | Li | H01S 3/10061 |
| 10,826,613 | B1* | 11/2020 | Liang | G02B 6/425 |
| 10,868,631 | B2* | 12/2020 | Liu | H04B 10/6161 |
| 2005/0123300 | A1* | 6/2005 | Kim | H04J 14/0246 398/84 |
| 2012/0014639 | A1* | 1/2012 | Doany | G02B 6/4202 385/14 |
| 2012/0057883 | A1* | 3/2012 | Andre | H04B 10/2587 398/208 |
| 2012/0207470 | A1* | 8/2012 | Djordjevic | H04J 14/0201 398/44 |
| 2013/0148963 | A1* | 6/2013 | Cvijetic | H04B 10/548 398/45 |
| 2014/0126915 | A1* | 5/2014 | Gruner-Nielsen | H04B 10/2581 398/143 |
| 2014/0140694 | A1* | 5/2014 | Zhou | H04J 14/02 398/44 |
| 2015/0030325 | A1* | 1/2015 | Chang | H04J 14/04 398/44 |
| 2015/0188659 | A1* | 7/2015 | Lipson | H04J 14/02 398/44 |
| 2015/0270920 | A1* | 9/2015 | Cavaliere | H04J 14/0232 398/44 |
| 2016/0285579 | A1* | 9/2016 | Li | H04J 14/02 |
| 2017/0353242 | A1* | 12/2017 | Mansouri Rad | H04B 10/07953 |
| 2017/0366267 | A1* | 12/2017 | Campos | H04B 10/25754 |
| 2017/0373787 | A1* | 12/2017 | Moon | H04B 10/0793 |
| 2018/0013494 | A1* | 1/2018 | Young | G02B 6/30 |
| 2019/0173604 | A1* | 6/2019 | Xie | H04J 14/04 |
| 2020/0158964 | A1 | 5/2020 | Winzer et al. | |

OTHER PUBLICATIONS

Froese, Michelle, "Intel demos co-packaged optics Ethernet switch, a first for the industry", https: www.engineersgarage.com news intel-demos-co-packaged-optics-ethernet-switch-a-first-for-the-industry , (Mar. 11, 2020), 5 pgs.

Hardy, Stephen, "Microsoft, Facebook form Co-Packaged Optics Collaboration", https: www.lightwaveonline.com optical-tech components article 16667809 microsoft-facebook-form-copackaged-optics-collaboration, (Mar. 15, 2019), 10 pgs.

"European Application Serial No. 20205227.0, Extended European Search Report dated Apr. 29 2021", 9 pgs.

Chen, L, et al., "Silicon Photonics in Optical Coherent Systems", 2018 23rd Opto-electronics and Communications Conference (OECC), IEEE, (Jul. 2, 2018), 1-2.

Hoose, Tobias, et al., "Hardwire-Configurable Photonic Integrated Circuits Enabled by 3D Nano-Printing", arxiv.org, Cornell University Library, 201 Olin Library Cornell University Ithaca, NY 14853, (Dec. 19, 2019), 16 pgs.

\* cited by examiner

US 11,159,238 B1

EXTERNAL LASER ENABLED CO-PACKAGED OPTICS ARCHITECTURES

TECHNICAL FIELD

The present disclosure generally relates to optical and electrical devices and more particularly to integration of sourceless co-packaged silicon switch and photonic circuits.

BACKGROUND

The growth of network traffic of data centers has driven a demand for higher capacity and lower power consumption. One approach is moving the optical components of chips (e.g., optical transceivers) closer to the silicon switch and integrating some of the IC components traditionally on the host board. In some approaches, the silicon switch and optical/electrical components can be co-packaged on a single chip. While closely integrating the electrical and optical components can, in theory, enable higher capacities (e.g., smaller footprint) with lower power consumption and increased data speeds, these co-packaged approaches are difficult to design and often cannot be changed or reconfigured down the road if one or more devices fail.

BRIEF DESCRIPTION OF THE DRAWINGS

The following description includes discussion of figures having illustrations given by way of example of implementations of embodiments of the disclosure. The drawings should be understood by way of example, and not by way of limitation. As used herein, references to one or more "embodiments" are to be understood as describing a particular feature, structure, or characteristic included in at least one implementation of the inventive subject matter. Thus, phrases such as "in one embodiment" or "in an alternate embodiment" appearing herein describe various embodiments and implementations of the inventive subject matter, and do not necessarily all refer to the same embodiment. However, they are also not necessarily mutually exclusive. To easily identify the discussion of any particular element or act, the most significant digit or digits in a reference number refer to the figure ("FIG.") number in which that element or act is first introduced.

Descriptions of certain details and implementations follow, including a description of the figures, which may depict some or all of the embodiments described below, as well as discussing other potential embodiments or implementations of the inventive concepts presented herein. An overview of embodiments of the disclosure is provided below, followed by a more detailed description with reference to the drawings.

DETAILED DESCRIPTION

In the following description, for the purposes of explanation, numerous specific details are set forth in order to provide an understanding of various embodiments of the inventive subject matter. It will be evident, however, to those skilled in the art, that embodiments of the inventive subject matter may be practiced without these specific details. In general, well-known instruction instances, structures, and techniques are not necessarily shown in detail.

As discussed, co-packaged electrical-optical designs for optical communication modules (e.g., transceiver chips, switch chips) can reduce the power consumption, but it can be difficult to implement the co-packaged approaches in a way that provides reconfigurability for light sources and component failures. To this end, an optical sourceless co-packaged architecture can be implemented to offer the benefit of co-packaged optic architecture low power consumption while enabling reconfigurability of the architecture for different modulation formats and optical sources. The optical sourceless co-packaged architecture can receive light from one or more light banks, or laser sub-assemblies that are external to the optical sourceless co-packaged architecture and can be changed as required per implementation. In some example embodiments, the optical sourceless co-packaged architecture comprises a plurality of optical transmitters that can transmit in different modulation formats, such as m-ary pulse amplitude modulation (M-PAM), or m-ary quadrature amplitude modulation (M-QAM). The different channels or beams of light from the different light sources that are destined to different transceiver modules can be combined and separated using one or more spatial mode couplers that convert each channel of light into a different higher order optical mode and couple the channels in the different higher order modes on a fiber that transmits multiple optical modes (e.g., few mode fiber). The optical sourceless co-packaged architecture is coupled to the fiber and receives the different channels and separates them based on their different spatial modes using another mode coupler that operates as a mode-based splitter that also converts each channel of light into a lower order mode (e.g., fundamental mode, Gaussian mode). The separated channels are then input to different transmitter modules for modulation and transfer to various destinations (e.g., remote receivers, internal receivers), as discussed in further detail below.

Figure 1:
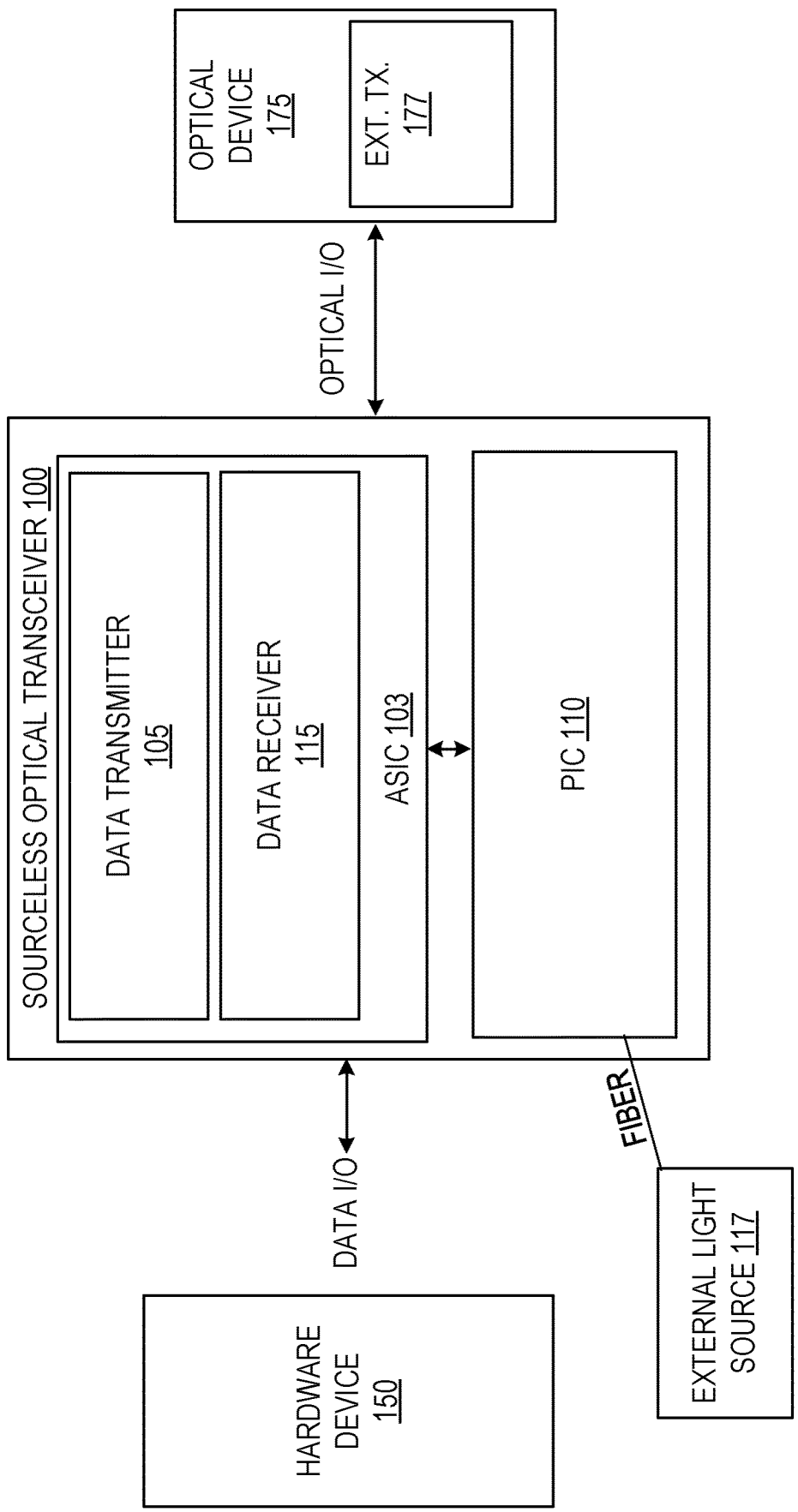
FIG. 1 is a block diagram illustrating a sourceless optical transceiver for transmitting and receiving optical signal, according to some example embodiments.

FIG. 1 is a block diagram illustrating a sourceless optical transceiver 100, according to some example embodiments. The optical transceiver 100 is an example of a co-packaged chip architecture that can include one or more transceiver modules in a photonic integrated circuit (PIC) that modulate light from an external light source 117 (e.g., laser bank, quantum dot lasers, etc.) that is coupled via a fiber (e.g., few mode fiber).

As illustrated, the sourceless optical transceiver 100 is implemented to interface electrical data from electrical devices, such as electrical hardware device 150; converts the electrical data into optical data; and sends and receives the optical data with one or more optical devices, such as optical device 175 (e.g., an external transmitter 177 of a remote optical device, switch, server, etc.). For explanatory purposes, in the following description, the electrical hardware device 150 is a host board that "hosts" the optical transceiver 100 as an optical engine that sends and receives data to an optical switch network, where, for example, optical device 175 can be other components of an optical switch network (e.g., IP/L2 switch, OTN (L1) switch). However, it is appreciated that the system can be implemented to interface other types of electrical devices and optical devices. For instance, optical transceiver 100 can be implemented as a single chip on a hybrid Ethernet switch co-package that uses an optical network (e.g., waveguides, fibers) as an optical bus to interconnect on-board electrical chips that process the data after it is converted from light into binary electrical data, according to some example embodiments.

In some example embodiments, the hardware device 150 includes an electrical interface for communicating with an electrical interface of the optical transceiver 100. The optical transceiver 100 may be a removable front end module that may be physically received by and removed from hardware device 150 operating as a back end module within a communication system or device. The optical transceiver 100 and the hardware device 150, for example, can be components of an optical communication device (e.g., a network device) such as a single channel intensity modulator/direct detection (IM/DD) transceiver, single channel coherent transceiver, wavelength-division multiplexing (WDM) based multi-channel IM/DD transceiver, or WDM based multi-channel coherent transceiver. M-ary PAM formats can be used in the IM/DD transceiver, while M-ary phase-shift keying (M-PSK) or M-ary quadrature amplitude modulation (M-QAM) formats can be used in the coherent transceiver.

A data transmitter 105 of the optical transceiver 100 can receive the electrical signals from hardware device 150, which are then converted into optical signals via one or more transmitter modules in the PIC 110 (e.g., an optical modulator, waveguides, a modulator driver). The PIC 110 can then output the optical signals via optical links, such as fiber or waveguides that interface with the PIC 110, to other components. The output light data can then be processed by other components (e.g., switches, endpoint servers, other embedded chips of a single embedded system), via a network such as a wide area network (WAN), optical switch network, optical waveguide network in an embedded system, and others.

In receiver mode, the optical transceiver 100 can receive high data rate optical signals via one or more optical links from optical device 175. The optical signals are converted by the PIC 110 from light into electrical signals for further processing by data receiver 115, such as demodulating the data into a lower data rate for output to other devices, such as the electrical hardware device 150. In some example embodiments, the data transmitter 105 and data receiver 115 are formed as a single electrical circuit structure, such as ASIC 103. The ASIC 103 can further include other circuit structures, including, for example, a switch ASIC or one or more digital signal processing (DSP) portions to provide further data processing functionality.

Figure 2:
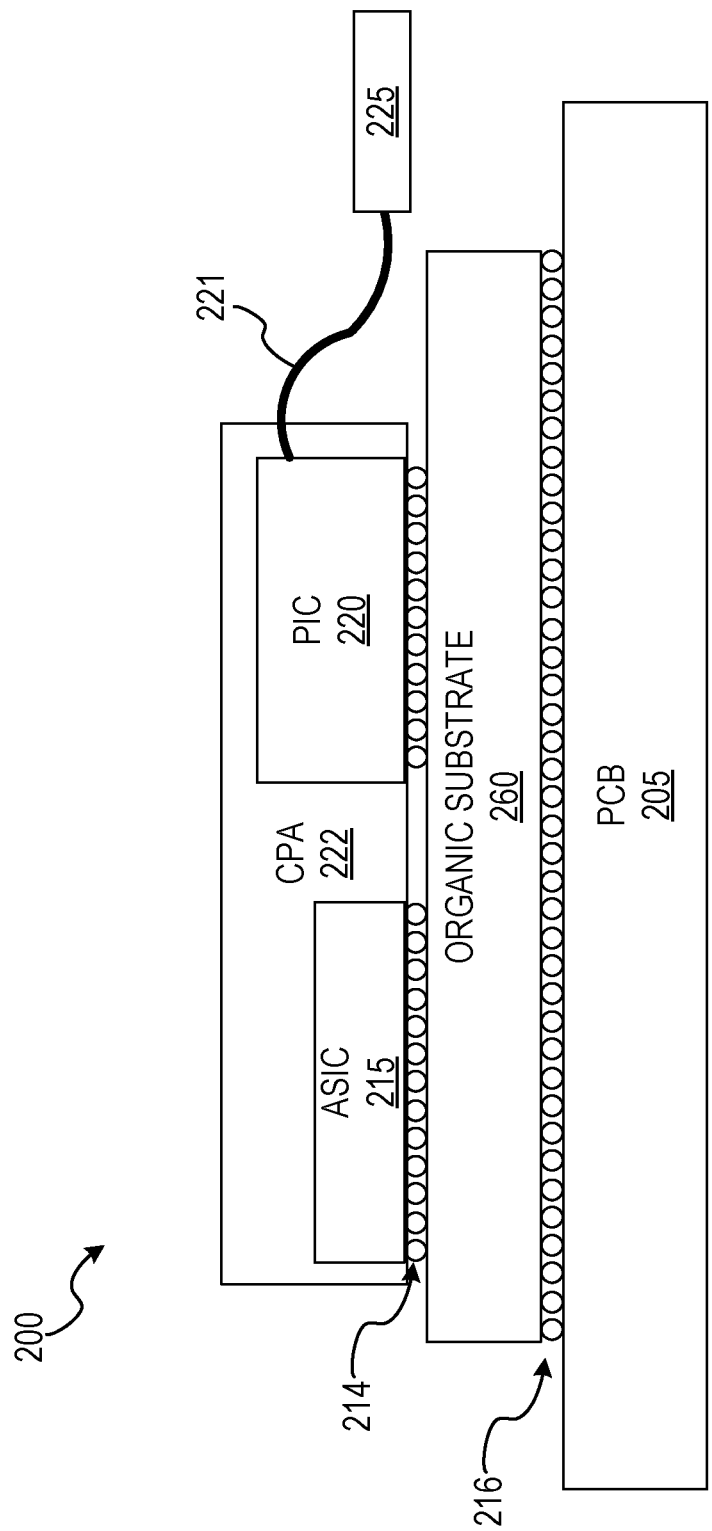
FIG. 2 is an illustration of a sourceless opto-electrical device (e.g., optical transceiver, sourceless co-packaged optical Silicon switch) including one or more optical devices, according to some example embodiments.

FIG. 2 is an illustration of a sourceless opto-electrical device 200 (e.g., optical transceiver 100, sourceless co-packaged optical switch 605) including one or more optical devices, according to some example embodiments. In this embodiment, the sourceless opto-electrical device 200 is shown to include printed circuit board (PCB) substrate 205, organic substrate 260, and a co-packaged architecture 222, which includes an application-specific integrated circuit (ASIC) 215 (e.g., data transmitter 105, data receiver 115, packet-digital switches 340A/340B, ASIC 610) and PIC 220 (e.g., transmitter components, such as co-packaged modules 330, 335 of FIG. 3 discussed below).

In some example embodiments, the PIC 220 includes silicon on insulator (SOI) or silicon based (e.g., silicon nitride (SiN)) devices, or may comprise devices formed from both silicon and a non-silicon material. Said non-silicon material (alternatively referred to as "heterogeneous material") may comprise one of III-V material, magneto-optic material, or crystal substrate material. III-V semiconductors have elements that are found in group III and group V of the periodic table (e.g., Indium Gallium Arsenide Phosphide (InGaAsP), Gallium Indium Arsenide Nitride (GainAsN)). The carrier dispersion effects of III-V-based materials may be significantly higher than in silicon-based materials, as electron speed in III-V semiconductors is much faster than that in silicon. In addition, III-V materials have a direct bandgap, which enables efficient creation of light from electrical pumping. Thus, III-V semiconductor materials enable photonic operations with an increased efficiency over silicon for both generating light and modulating the refractive index of light. Thus, III-V semiconductor materials enable photonic operation with an increased efficiency at generating light from electricity and converting light back into electricity.

The low optical loss and high quality oxides of silicon are thus combined with the electro-optic efficiency of III-V semiconductors in the heterogeneous optical devices described below; in embodiments of the disclosure, said heterogeneous devices utilize low loss heterogeneous optical waveguide transitions between the devices' heterogeneous and silicon-only waveguides.

Magneto-optic (MO) materials allow heterogeneous PICs to operate based on the MO effect. Such devices may utilize the Faraday Effect, in which the magnetic field associated with an electrical signal modulates an optical beam, offering high bandwidth modulation, and rotates the electric field of the optical mode, enabling optical isolators. Said MO materials may comprise, for example, materials such as iron, cobalt, or yttrium iron garnet (YIG). Further, in some example embodiments, crystal substrate materials provide heterogeneous PICs with a high electro-mechanical coupling, linear electro-optic coefficient, low transmission loss, and stable physical and chemical properties. Said crystal substrate materials may comprise, for example, lithium niobate (LiNbO3) or lithium tantalate (LiTaO3).

In the example illustrated, the PIC 220 exchanges light with an external light source 225 (e.g., light source 117, light source subassembly 305) via fiber 221 (e.g., few mode fiber (FMF), multicore fiber). The fiber 221 can couple with the PIC 220 using a prism, grating, or lens, according to some example embodiments. In other example embodiments, multiple fibers are implemented to receive light at different light sources, as discussed in further detail below with reference to FIG. 6

In some example embodiments, the optical devices of PIC 220 are controlled, at least in part, by control circuitry included in ASIC 215. Both ASIC 215 and PIC 220 are shown to be disposed on copper pillars 214, which are used for communicatively coupling the PICs via organic substrate 260. PCB substrate 205 is coupled to organic substrate 260 via ball grid array (BGA) interconnect 216 and may be used to interconnect the organic substrate 260 (and thus, ASIC 215 and PIC 220) to other components of the sourceless opto-electrical device 200 not shown (e.g., interconnection modules, power supplies, etc.).

Figure 3:
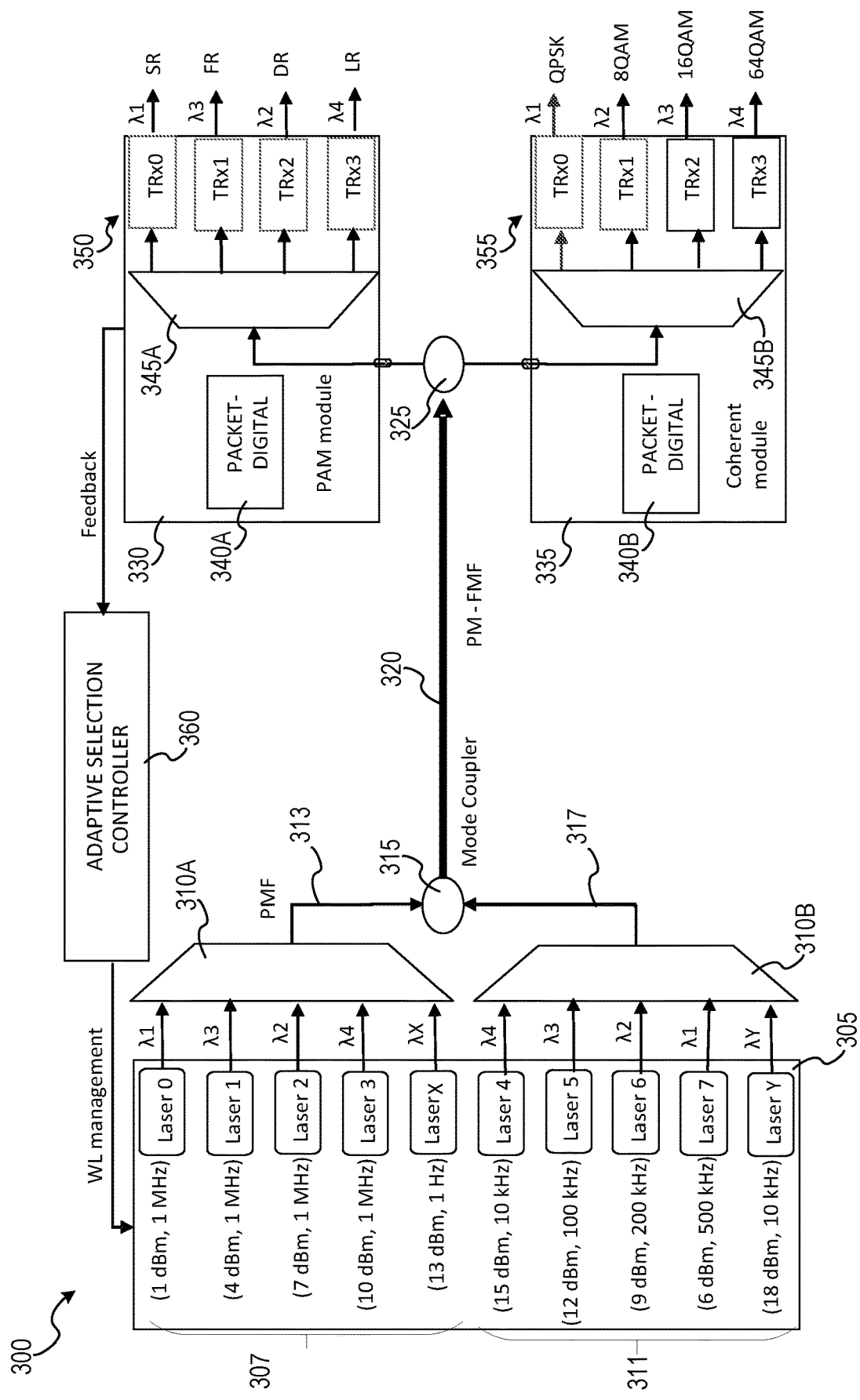
FIG. 3 shows an external laser-enabled sourceless co-packaged optics architecture, according to some example embodiments.

FIG. 3 shows a sourceless optical transmitter architecture 300, according to some example embodiments. A light source subassembly 305 (e.g., laser bank, optical box with a set of laser diodes), with multiple light sources functions as an external source of light to be input into the plurality of sourceless co-packaged optics modules, including PAM module 330 and coherent module 335. In some example embodiments, one or more of the light sources in the light source subassembly 305 can be a different type of light source (e.g., distributed feedback laser, quantum dot laser, an external cavity laser). In some example embodiments, each of the included light sources have different optical characteristics, such as linewidth, optical power, or relative intensity noise.

The sourceless optical transceiver 100 is laserless or sourceless that can operate using light provided from an external source. That is, for example, the sourceless optical transceiver 100 would still be laserless with respect to the PAM module 330 and the coherent module 335 even where the co-packaged chip (e.g., sourceless optical transceiver 100, sourceless co-packaged optical switch 605) includes an optical source, so long as one or more of the CPO modules in the chip receives light from an optical source (e.g., via fiber), according to some example embodiments. In the illustrated embodiments, the light source subassembly 305 comprises a plurality of lasers, including a first set of lasers 0, 1, 2, 3, X and a second set of lasers 4, 5, 6, 7, Y.

The first set of lasers 0, 1, 2, 3, and X can be configured to generate multiple wavelengths of light, $\lambda 1$-$\lambda 4$, at the same or different powers, for use by a transmitter module, such as the PAM module 330, according to some example embodiments. In particular, for example, laser 0 generates $\lambda 1$ light at 1 decibel-milliwatt (dBm) output power and 1 megahertz (MHz) linewidth, laser 1 generates $\lambda 3$ light at 4 dBm output power and 1 MHz linewidth, laser 2 generates $\lambda 2$ light at 7 dBm output power and 1 MHz linewidth, laser 3 generates $\lambda 4$ light at 10 dBm output power and 1 MHz linewidth, and laser X, which is a tunable laser that generates light having changeable characteristics. In some example embodiments, laser X is a redundancy light source that can be configured to generate light having any power to 13 dBm, and a tunable frequency range that can be configured for any frequency between $\lambda 1$ to $\lambda 4$. Laser X can be configured to generate a replacement channel light beam to replace any of the lasers 0, 1, 2, 3 should they malfunction. For example, if light from laser 1 is not being received by the PAM module 330, adaptive selection controller 360 (e.g., a user device, desktop PC) can use a data interface to receive data indicating one of the lasers is malfunctioning, and use the data interface to tune laser X to generate $\lambda 3$ light at 4 dBm power to replace the malfunctioning laser 1. In some example embodiments, multiple lasers generate light at the same time for a given transmitter. For example, lasers 0-3 can simultaneously generate light which is then combined and input into the PAM module 330 as discussed here (e.g., spatial mode coupling for combining and separating the multi-wavelength light destined for the PAM module 330 from light destined to other transmitter modules).

The second set of lasers 4, 5, 6, 7, and Y can be configured to generate multiple wavelengths of light, $\lambda 1$-$\lambda 4$, at the same or different powers and linewidth, for use by another transceiver module, such as the coherent module 335, according to different example embodiments. In particular, for example, laser 4 generates $\lambda 4$ light at 15 dBm output power and 10 kHz linewidth, laser 5 generates $\lambda 3$ light at 12 dBm output power and 100 kHz linewidth, laser 6 generates $\lambda 2$ light at 9 dBm output power and 200 kHz linewidth, laser 7 generates $\lambda 1$ light at 6 dBm output power and 500 kHz linewidth, and laser Y, which is a tunable laser that can generate different types of light. In some example embodiments, laser Y is a redundancy light source for the second set of lasers that can be configured to generate light having any power up to 18 dBm, and a tunable frequency range that can be configured for any frequency between $\lambda 1$ to $\lambda 4$. Laser Y can be configured to function as a replacement channel light source to replace any of the lasers 4, 5, 6, 7 should they malfunction. For example, if light from laser 7 is not being received by the coherent module 335, then the adaptive selection controller 360 (e.g., client device) can use a data interface (e.g., serial interface) to receive data indicating one of the lasers is malfunctioning, and use the data interface to tune laser Y to generate $\lambda 1$ light at 6 dBm power to replace the malfunctioning laser 7.

The PAM CPO module 330 can receive the light generated by one or more of the first set of lasers in the light source subassembly 305 and input the light into one or more PAM4 transceiver 350 using MUX 345A (e.g., a polarization maintaining multiplexer in demultiplexer/splitting mode). The transceivers 350 are PAM4 transceivers of different types including a PAM4-SR transceiver ("TRx0") transmitting/receiving PAM4 data over 100 meters using single or multiple fibers, PAM4-FR transceiver ("TRx1") transmitting/receiving PAM4 data over 2 kilometers using single or multiple fibers, PAM4-DR transceivers ("TRx2") transmitting/receiving PAM4 data over 500 meters using single or multiple fibers, and PAM4-LR transceiver ("TRx3") transmitting/receiving PAM4 data over 10 kilometers. Although in the example of FIG. 3 (and FIG. 5), the PAM CPO module 330 comprises four transceivers, it is appreciated that the PAM CPO module 330 can include a different number of transceivers (e.g., 1 PAM transceiver, 20 PAM transceivers), or transmitters without receivers, and so on, according to some example embodiments.

The coherent CPO module 335 is a coherent module that can receive light generated by one or more of the second set of lasers in the light source subassembly 305 and input the light into one or more coherent transmitters 355 using MUX 345B (in demux mode). For example, the coherent module 355 is configured to a coherent detector receiver that mix the local oscillator light with the optical signals to demodulate the received coherent light beam data. The transmitters 355 are coherent transmitters of different types including a QPSK transmitter ("TRx0"), an 8QAM transmitter ("TRx1"), a 16 QAM transmitter ("TRx2"), and a 64QAM transmitter ("TRx3"). Although in the example of FIG. 3 (and FIG. 5), the coherent CPO module 335 comprises four transceivers, it is appreciated that the coherent CPO module 335 can include a different number of transceivers (e.g., 1 coherent transceiver, 20 coherent transceivers), or coherent transmitters without receivers, and so on, according to some example embodiments.

Further, although only two CPO modules are illustrated in FIG. 3, it is appreciated that additional modules can be implemented, such as a WDM module in which all the transmitters receive the low power of light at different wavelengths to transmit WDM a short distance (e.g., 500 m) over a single fiber, and a second WDM module in which all the transmitters in the second WDM module receive high power light at different wavelengths to transmit WDM data for longer distances (e.g., 2 km) over a single mode fiber. Further, in the example illustrated, each of the modules includes electronic control circuitry, such as a packet-digital circuit 340A and 340B, to communicate with different transceivers, while in other example embodiments, the electronic control circuit is located in another circuit structure, such as ASIC 610 in FIG. 610.

The light from the different sets of lasers in the light source subassembly 305 are directed towards specific CPO modules using few-mode couplers, including spatial mode couplers 315 and 325, and a polarization maintaining few mode fiber 320 (PM-FMF), which support different spatial modes of light. Generally, few mode components (e.g., fibers, couplers) transmit multiple mode channels (multiple wavelength channels can be used to transmit light in each mode) in a single component (e.g., fiber, coupler), where each mode channel takes an independent spatial pathway (e.g., different modes). The channels may be multiplexed together using a spatial mode multiplexer and transmitted across a multi-spatial mode fiber (e.g., a few mode fiber, which is physically larger than single mode fiber and configured to support several transverse spatial modes on a single medium, as opposed to a multicore fiber which transmits different spatial channels on different cores).

The spatially multiplexed channels may be received using a spatial mode demultiplexer, which separates the channels by their different spatial modes for further routing (e.g., to different receivers for each channel, etc.). As an example, and with reference to FIG. 3, light from one or more lasers in the first set of lasers 307 is coupled via a polarization maintaining single mode coupler 310A to single mode fiber 313 (a polarization maintaining single mode fiber), which is further coupled to the few-mode coupler 315. Similarly, light from one or more lasers in the second set of lasers 311 is coupled via a polarization maintaining single mode coupler 310B along another single mode fiber 317 to the few mode coupler 315. The mode coupler 315 then converts the received light into different modes, combines them, and outputs the mode light onto the polarization maintaining FMF 320 (e.g., a few-mode fiber that supports several linearly polarized (LP) spatial modes, such as $LP_{01}$, $LP_{11}$, $LP_{21}$, $LP_{02}$) and different orientations, such as LP ii and $LP_{21}$, discussed below). In particular, for example, the mode coupler 315 converts the light from the fiber 313 to a first mode (e.g., mode-1, $LP_{11}$), and light from the other fiber 317 to a second different mode (e.g., mode-2, $LP_{21}$), which are combined and output onto FMF 320.

The FMF 320 is then coupled to another mode coupler 325, which is configured to separate or demultiplex the received channels (e.g., mode-1 and mode-2) onto different paths. For example, the mode coupler 325 converts the first mode of light (mode-1, from one or more of the first set of lasers 307) into a fundamental mode (e.g., Gaussian mode, $LP_{01}$), and inputs the light into the PAM module based co-packaged optics 330 for processing (e.g., via one or more of the PAM4 transceivers 350). Further, the mode coupler 325 converts the second mode of light (mode-2, from the second set of lasers 311) into a Gaussian mode on another fiber, which then inputs the light into the coherent CPO module 335 for processing (e.g., via one or more of the transmitters 355 for different types of coherent modulation-based communication). Further, a portion of the light input into the coherent CPO module 335 may remain unmodulated and be transmitted to the receiver at the destination for coherent signal processing. In some example embodiments, the mode coupler 325 is an embedded spatial mode coupler that is integrated into a sourceless CPO chip architecture, such as sourceless optical transceiver 100 or sourceless co-packaged optical switch 605.

Figure 4:
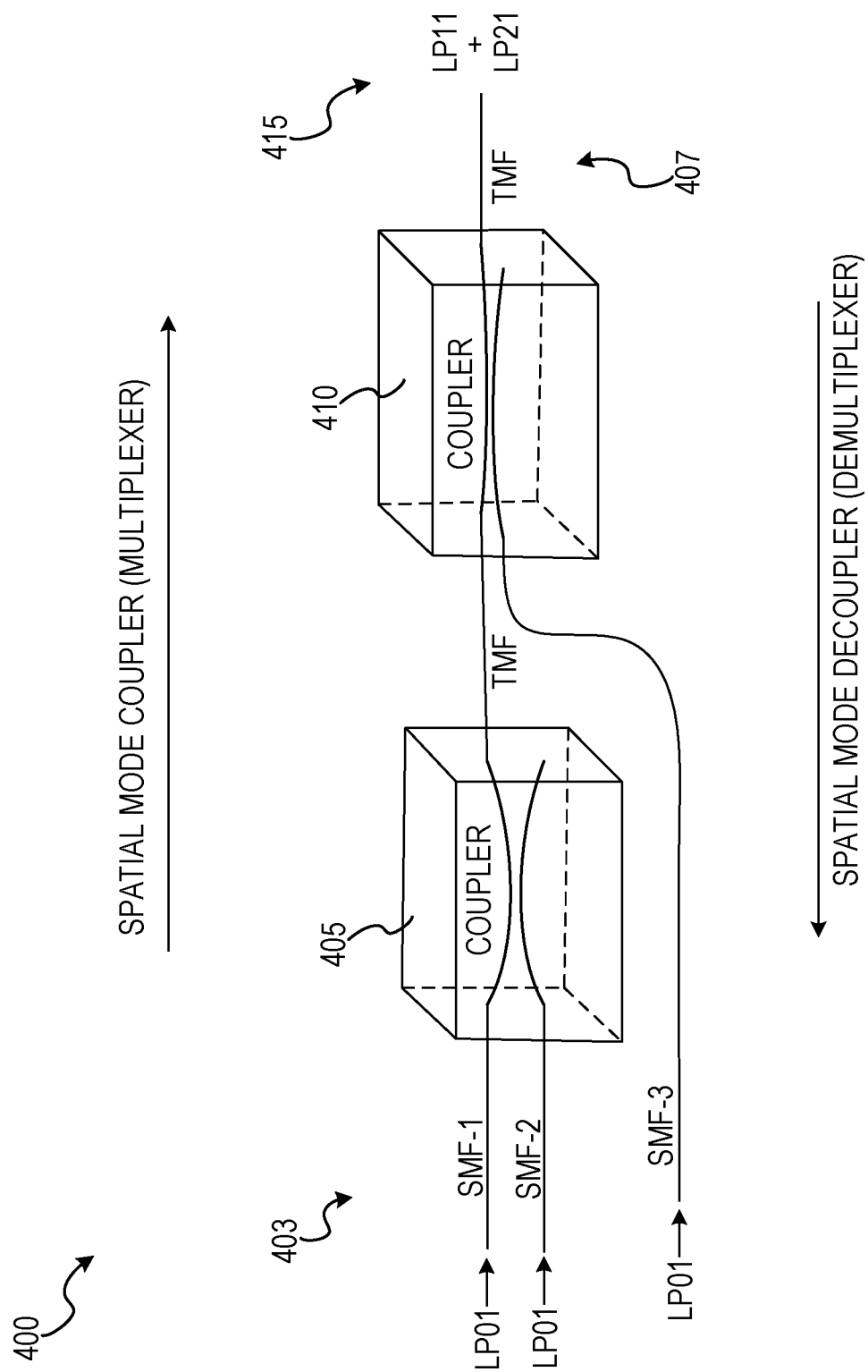
FIG. 4 shows an example mode coupler architecture, according to some example embodiments

FIG. 4 shows an example mode coupler architecture 400, according to some example embodiments. In the illustrated example, the mode coupler architecture 400 includes two couplers 405 and 410 (e.g., 2×2 couplers), which can generate and separate higher spatial modes. In particular, the mode coupler 315 (FIG. 3) can implement mode coupler architecture 400 to generate higher order spatial modes (e.g., LP11, LP21) in a multiplexer or combining mode (input light on the single mode ports 403 on the left side of mode coupler architecture 400; output light on the port 407, on the right side of the mode coupler architecture 400). Further, the mode coupler 325 (FIG. 3) can be implemented as a reverse configuration of mode coupler architecture 400, in which light is received on the port 407 (from FMF 320, FIG. 3) and separates higher order spatial modes into Gaussian modes in demultiplexer or splitter mode (from right to left). Although in the example of FIG. 4 a two coupler architecture is implemented for the mode couplers 315, 325 it is appreciated that other configurations with additional components (e.g., splitters, gratings) can be implemented to provide spatial mode coupling combing and separating functionality to provide light to the sourceless optical transceiver 100, according to different example embodiments.

As an illustrative example, the light from the fiber 313 is split onto two single mode fibers, SMF-1 and SMF-2, each of which carries the light in the Gaussian mode LP01, which are input into coupler 405 to generate higher order light LP11, and LP01 (which can be filtered or discarded). The light from the coupler 405 is then input into one of the coupler ports of coupler 410 (via FMF connecting the couplers 405 and 410), where the other coupler port of 410 receives light from the fiber 317 for coupling with the light from the coupler 405. That is, the light from fiber 317 is input directly into coupler 410 using another single mode fiber, SMF-3, in its Gaussian spatial mode LP01.

The coupler 410 then couples the light from coupler 405 and the light from fiber 317 to generate high-order mode light 415, which can propagate over few mode fiber (e.g., FMF 320, FIG. 3) to its destination, such as the mode coupler 325 on the sourceless optical transceiver 100. The mode coupler 325 can have two other couplers in the reverse configuration illustrated in mode coupler architecture 400 to separate the light to the different modules. That is, for example and with reference to mode coupler architecture 400, the mode coupler receives light on the port 407, and converts one channel of light in higher mode LP21 into Gaussian mode LP01, which is then output onto SMF-3, which is then input into one of the transmitter modules (e.g., PAM module 330). Further, the other higher mode of light LP11 (along with LP01) is output by the port of coupler 410 (on the left side of coupler 410), which is then separated further by coupler 405 to generate two beams each in Gaussian mode onto SMF-1 and SMF-2, where one of the fibers can be used to input that channel of light into one or more other transmitter modules, such as coherent module 335. As discussed, it is appreciated that different mode coupler configurations can be implemented to yield different configurations of outputs and powers, according to how many transmitter modules are to receive light from the external sources.

Figure 5:
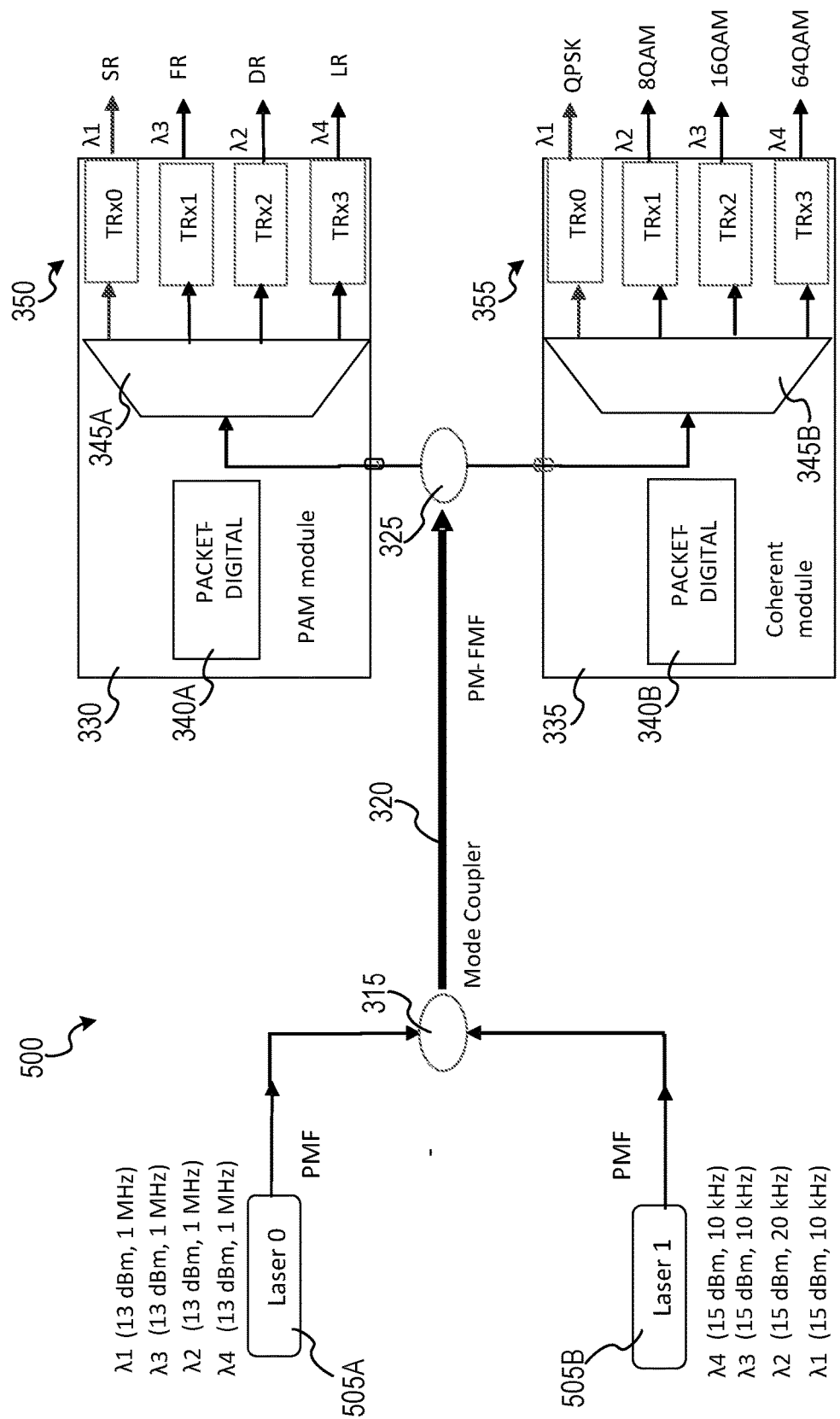
FIG. 5 shows a sourceless optical subsystem architecture implementing quantum dot lasers as external light sources, according to some example embodiments.

FIG. 5 shows a sourceless optical subsystem architecture 500 implementing quantum dots as light sources, according to some example embodiments. In contrast to the sourceless optical transmitter architecture 300 in FIG. 3, the total number of lasers is reduced and the quantum dot lasers are implemented to generate multiple wavelengths of coherent light in a single beam, which then can be filtered to select the desired beam for output. The quantum dot lasers can be fabricated as monolithic light sources grown directly on silicon (e.g., InGaAs quantum dots). In each of the quantum dot lasers 505A and 505B, an active region between the p-cladding region and the n-cladding region comprises one or more quantum dots, each of which can generate light at a certain wavelength depending on the size and other characteristics of a given dot. Upon applying electricity to the active region, multi-beam coherent quantum laser light is generated for output, where power is proportional to the quantum dot density in the active region between the claddings and upon the applied electricity (e.g., current, voltage).

As an example, the quantum dot laser 505A can generate light that contains multiple beams of coherent light (e.g., λ1, λ2, λ3, λ4) and one of the beams can be selected by filtering out the other beams (e.g., filtering out λ2-λ4) to generate the desired output light from the quantum dot laser 505A (e.g., λ1). Similarly, laser 505B can be a differently configured quantum dot laser (higher power) that generates multiple beams of coherent light at one or more wavelengths, which are similarly filtered to generate desired output light from the quantum dot laser 505B. The light from each of the quantum dot lasers 505A and 505B can then be combined via the few mode fiber and mode couplers, as discussed above.

Figure 6:
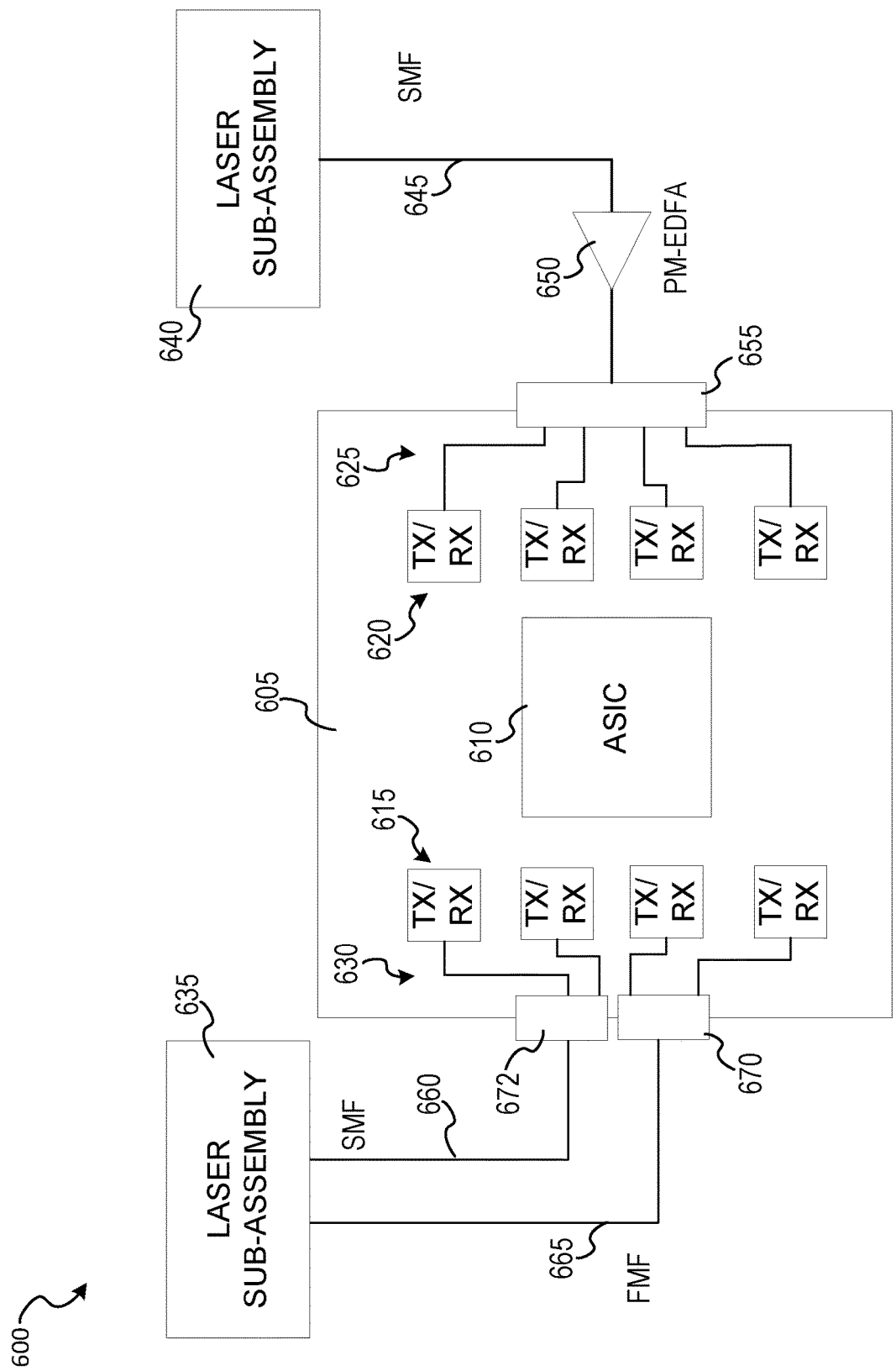
FIG. 6 shows an optical sourceless co-packaged architecture, according to some example embodiments.

FIG. 6 shows an optical sourceless co-packaged architecture 600, according to some example embodiments. In the example illustrated, the sourceless co-packaged optical switch 605 includes an electrical circuit, e.g., ASIC 610, that provides electrical interconnections for optical components, including, for example a first set of optical transceivers 615 and a second set of transceivers 620. The light processed by the optical sourceless co-packaged architecture 600 can be multidimensional and different types of transceivers and optical components can combine, separate, and process the light using different mechanisms (e.g., wavelength based coupling, spatial mode based coupling, and beam splitting), according to some example embodiments.

The sourceless co-packaged optical switch 605 is laserless; light is input into the sourceless co-packaged optical switch 605 by external light sources, laser subassembly 635 and laser subassembly 640. The laser subassembly 640 can include multiple lasers, which are input via a polarization maintaining single mode fiber 645 (e.g., carrying multiple wavelengths of light) that is coupled into the sourceless co-packaged optical switch 605 by the optical interface 655 (e.g., splitter, demultiplexer). The light at different wavelengths propagates in the fiber 645 and can be amplified by a fiber amplifier 650 (e.g., polarization maintaining-Erbium Doped Fiber Amplifier (PM-EDFA)) and then input into the chip by optical interface 655, which splits and couples the light to the transceivers 620 via waveguides 625.

The laser subassembly 635 includes a set of light sources that generate light from the set of optical transceivers 615 for processing (e.g., transmitting and receiving via the ASIC 610). In the example of FIG. 6, a single mode fiber 660 and few-mode fiber 665 each carry light that is input into the couplers, including splitter 672 and few-mode coupler 670 (e.g., spatial mode coupler). The two fibers 660 and 665 can be part of a ribbon cable that connects to connector 670 of the sourceless co-packaged optical switch 605. The laser subassembly 635 can include two mode couplers that generate light for each of the fibers 660 and 665, which are then separated or decoupled via the coupler 672 (via splitting) and coupler 670 (via spatial mode decoupling).

Figure 7:
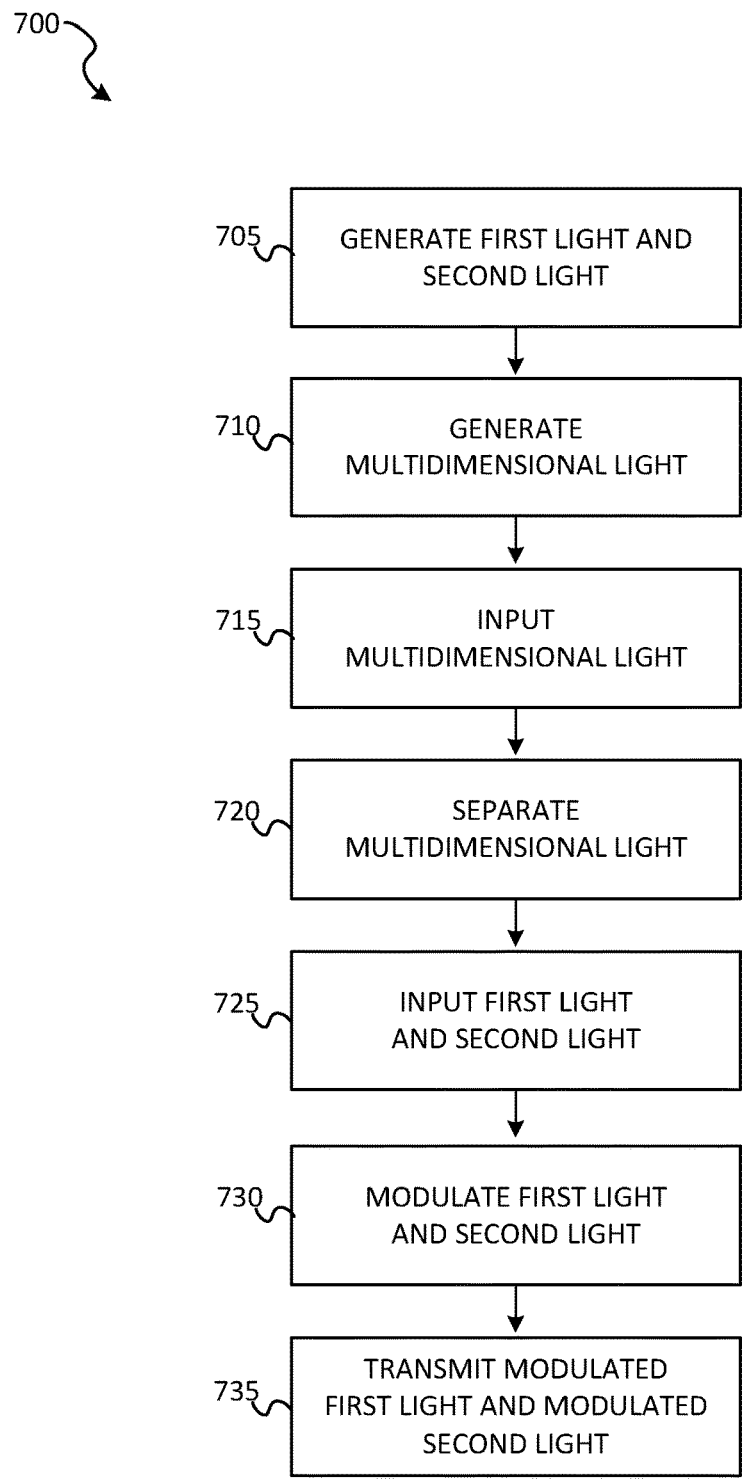
FIG. 7 shows a flow diagram of a method for routing light using a laserless co-packaged architecture, according to some example embodiments.

FIG. 7 shows a flow diagram of a method 700 for processing light using a laserless co-packaged architecture, according to some example embodiments. At operation 705, a first external light source (e.g., any of lasers 0, 1, 2, 3, or X) generates a first light beam and a second external light source (e.g., any of lasers 4, 5, 6, 7, or Y) generates a second light beam.

At operation 710, a coupler combines multidimensional light (e.g., light in different wavelengths, light in different spatial modes, light on different fiber cores). For example, at operation 710, the mode coupler 315 converts the light received from laser 5 from its original base mode (Gaussian) to a higher order mode (LP11) and further converts the light from laser 7 from its base mode to another higher mode (LP21), and combines the higher order modes to generate multimode light. As an additional example, at operation 710, the laser subassembly 640 generates multi-wavelength light (WDM).

At operation 715, the multidimensional light is input into an optical sourceless co-packaged chip. For example, at operation 715, the multimode light propagates on a few mode fiber (e.g., FMF 320, FMF 665) and is input to the chip via an optical connector (e.g., FMF coupler 670, a lens, a grating). Additionally, at operation 715, multiwavelength light on a single fiber is input into the optical sourceless co-packaged chip, according to some example embodiments.

At operation 720, the multidimensional light is separated. For example, at operation 720, an embedded optical spatial mode decoupler (e.g., coupler 325) receives the multimode light and separates the light onto different single mode channels, where the light is both converted from higher modes to the lower mode and separated by the mode decoupler. Additionally, at operation 720, multiwavelength light propagating on single mode fiber 645 is input into the optical interface 655, according to some example embodiments.

At operation 725, the first light set, and second light set are input into one or more CPO modules. For example, the first light set is input in its Gaussian mode into a PAM 4 CPO module, such as PAM CPO module 330 and the second light set is input in its Gaussian mode into a coherent CPO, such as coherent CPO module 335. In some example embodiments, the first light set and the second light set are input to the same type of CPO modules (e.g., both first and second light are input into direct detection modules, both first and second light are input into coherent modules). Additionally, and in accordance with some example embodiments, at operation 725, the multiwavelength light is separated by the optical interface 655 and input into the transceivers 620.

At operation 730, the first and second light sets are modulated by their respective transmitters. For example, the PAM module 330 uses optical modulators in its SR transceiver (e.g., TRxO of PAM transceivers 350, FIG. 3) to modulate PAM4 data onto the first light set. Further, the coherent module 335 uses optical modulators in its 16QAM transceiver to modulate 16QAM data onto the second light, and further input the second light set to the receiver for coherent demodulation and processing.

At operation 735, the modulated first and second lights are transmitted. For example, the PAM CPO module 330 transmits the PAM4 modulated light (e.g., to an external network or into an internal switch ASIC, such as ASIC 610) and the coherent CPO module 335 transmits the 16QAM modulated light (e.g., to an external network or device or into an internal ASIC, such as ASIC 610, for processing).

The following are example embodiments:

Example 1. A method comprising: receiving, by a co-packaged optical device, multimode light comprising a plurality of beams in different modes including a first mode and a second mode, the multimode light received from a few mode fiber coupled to the co-packaged optical device, the co-packaged optical device comprising a plurality of co-packaged optics modules configured to transmit and receive light in different modulation formats, the plurality of co-packaged optics modules including at least one or more direct detection transceivers or coherent transceivers; separating, using a coupler of the co-packaged optical device, a first beam of light from the first mode and a second beam of light from the second mode; modulating the first beam of light using one of the co-packaged optics modules and modulating the second beam of light using another of the co-packaged optics modules; and transmitting the first beam of light using the one of the co-packaged optics modules and transmitting the second beam of light using the another of the co-packaged optics modules.

Example 2. The method of example 1, wherein the one of the co-packaged optics modules comprises direct detection transceivers that modulate and transmit the first beam of light and the another of the co-packaged optics modules comprises coherent transceivers that modulate and transmit the second beam of light.

Example 3. The method of examples 1 or 2, wherein the transceivers in one of the co-packaged optics modules and the another of the co-packaged optics modules are both direct detection transceivers.

Example 4. The method of any of examples 1-3, wherein the transceivers in one of the co-packaged optics modules and the another of the co-packaged optics modules are both coherent transceivers.

Example 5. The method of any of examples 1-4, further comprising: receiving, by the co-packaged optics device, a first received beam of light and a second received beam of light; demodulating the first received beam of light using the one of the co-packaged optics modules; and demodulating the second received beam of light using the another of the co-packaged optics modules.

Example 6. The method of any of examples 1-5, wherein the first received beam of light is received by the one of the co-packaged optics modules, and wherein the second received beam of light is received by the another of the co-packaged optics modules.

Example 7. The method of any of examples 1-6, wherein the one or more direct detection transceivers include one or more pulse amplitude modulation (PAM) optical transceivers in a PAM module of the plurality of co-packaged optics modules.

Example 8. The method of any of examples 1-7, wherein the PAM optical transceivers are configured to modulate and demodulate in different PAM formats.

Example 9. The method of any of examples 1-8, wherein the one or more coherent transceivers include one or more quadrature amplitude modulation (QAM) optical transceivers in a coherent module of the plurality of co-packaged optics modules.

Example 10. The method of any of examples 1-9, wherein the QAM optical transceivers are configured to modulate and demodulate in different QAM formats.

Example 11. The method of any of examples 1-10, wherein the one or more coherent transceivers include one or more phase shift keying (PSK) optical transceivers in a coherent module of the plurality of co-packaged optics modules.

Example 12. The method of any of examples 1-11, wherein the PSK optical transceivers are configured to modulate and demodulate in different PSK formats.

Example 13. The method of any of examples 1-12, wherein the coupler is a spatial mode coupler that separates light based on different optical spatial modes.

Example 14. The method of any of examples 1-13, wherein the coupler is an optical splitter.

Example 15. The method of any of examples 1-14, wherein each of the one or more direct detection transceivers and the one or more coherent transceivers are photonic integrated circuit (PIC) transceivers that are co-packaged with electrical circuitry.

Example 16. The method of any of examples 1-15, wherein the co-packaged optical device comprises an integrated optical-electrical ethernet switch.

Example 17. The method of any of examples 1-16, wherein the integrated optical-electrical ethernet switch and the PIC transceivers are interconnected by an electrical interface.

Example 18. The method of any of examples 1-17, wherein the plurality of beams are generated by one or more external laser assemblies.

Example 19. The method of any of examples 1-18, wherein the one or more external laser assemblies are tunable or fixed light sources.

Example 20. A co-packaged optical device comprising: a plurality of co-packaged optics modules to transmit and receive light in different modulation formats, the plurality of co-packaged optics modules including at least one or more direct detection transceivers or coherent transceivers, the plurality of co-packaged optics modules to receive, from a few mode fiber coupled to the co-packaged optical device, multimode light comprising a plurality of beams in different modes including a first mode of light and a second mode of light; and a coupler to separate the first beam of light from the first mode of the multimode light and separate a second beam of light from the second mode of the multimode light, one of the co-packaged optics modules configured to modulate and transmit the first beam of light and another of the co-packaged optics modules configured to modulate and transmit the second beam of light.

Example 21: A method comprising: receiving, by a co-packaged optical device, multimode light comprising a plurality of beams in different modes including a first mode and a second mode, the multimode light received from a few-mode fiber coupled to the co-packaged optical device, the co-packaged optical device comprising a plurality of co-packaged optics modules configured to transmit and receive light in different modulation formats, the plurality of co-packaged optics modules including at least one or more direct detection transceivers or coherent transceivers; separating, using a few-mode coupler of the co-packaged optical device, a first beam of light from the first mode and a second beam of light from the second mode; modulating the first beam of light using one of the co-packaged optics modules and modulating the second beam of light using another of the co-packaged optics modules; and transmitting the first beam of light using the one of the co-packaged optics modules and transmitting the second beam of light using the another of the co-packaged optics modules.

Example 22. The method of example 21, wherein a transceiver in one of the co-packaged optics modules is a direct detection transceiver that modulates and transmits the first beam of light, and wherein another transceiver in the another of the co-packaged optics module is a coherent transceiver that modulates and transmits the second beam of light.

Example 23. The method of any of examples 21 or 22, wherein a transceiver in one of the co-packaged optics modules and another transceiver in the another of the co-packaged optics modules are both direct detection transceivers.

Example 24. The method of any of examples 1-23, wherein a transceiver in one of the co-packaged optics modules and another transceiver in the another of the co-packaged optics modules are both coherent transceivers.

Example 25. The method of any of examples 1-24, further comprising: receiving, by the co-packaged optical device, a first received beam of light and a second received beam of light; demodulating the first received beam of light using the one of the co-packaged optics modules; and demodulating the second received beam of light using the another of the co-packaged optics modules.

Example 26. The method of any of examples 1-25, wherein the first received beam of light is received by the one of the co-packaged optics modules, and wherein the second received beam of light is received by the another of the co-packaged optics modules.

Example 27. The method of any of examples 1-26, wherein the one or more direct detection transceivers include one or more pulse amplitude modulation (PAM) optical transceivers in a PAM module of the plurality of co-packaged optics modules.

Example 28. The method of any of examples 1-27, wherein the PAM optical transceivers are configured to modulate and demodulate in different PAM formats.

Example 29. The method of any of examples 1-28, wherein the one or more coherent transceivers include one or more quadrature amplitude modulation (QAM) optical transceivers in a coherent module of the plurality of co-packaged optics modules.

Example 30. The method of any of examples 1-29, wherein the QAM optical transceivers are configured to modulate and demodulate in different QAM formats.

Example 31. The method of any of examples 1-30, wherein the one or more coherent transceivers include one or more phase shift keying (PSK) optical transceivers in a coherent module of the plurality of co-packaged optics modules; and wherein the PSK optical transceivers are configured to modulate and demodulate in different PSK formats.

Example 32. The method of any of examples 1-31, wherein the coupler is a spatial mode coupler that separates light based on different optical spatial modes.

Example 33. The method of any of examples 1-32, wherein the coupler is an optical splitter that splits the light from a single mode fiber to each transceiver.

Example 34. The method of any of examples 1-33, wherein each of the one or more direct detection transceivers and the one or more coherent transceivers are photonic integrated circuit (PIC) transceivers that are co-packaged with electrical circuitry.

Example 35. The method of any of examples 1-34, wherein the co-packaged optical device comprises an integrated optical-electrical ethernet switch.

Example 36. The method of any of examples 1-35, wherein the integrated optical-electrical ethernet switch and the PIC transceivers are interconnected by an electrical interface.

Example 37. The method of any of examples 1-36, wherein the plurality of beams are generated by one or more external laser assemblies.

Example 38. The method of any of examples 1-37, wherein the one or more external laser assemblies are tunable or fixed light sources.

Example 39. The method of any of examples 1-38, wherein the one or more external laser assemblies include one or more of: a distributed feedback laser, a quantum dot laser, an external cavity laser; and wherein the one or more external laser assemblies have different optical characteristics including one or more of linewidth, output power, or relative intensity noise.

Example 40. A co-packaged optical device comprising: a plurality of co-packaged optics modules to transmit and receive single mode light in different modulation formats, the plurality of co-packaged optics modules including at least one or more direct detection transceivers or coherent transceivers, the plurality of co-packaged optics modules to receive, from a few-mode fiber coupled to the co-packaged optical device, multimode light comprising a plurality of beams in different modes including a first mode of light and a second mode of light and the light in each mode can contain multiple wavelength channels; and a coupler to separate the first beam of light from the first mode of the multimode light and separate a second beam of light from the second mode of the multimode light, one of the co-packaged optics modules to modulate and transmit the first beam of light and another of the co-packaged optics modules to modulate and transmit the second beam of light. Other embodiments of this aspect include corresponding computer systems, apparatus, and computer programs recorded on one or more computer storage devices, each configured to perform the actions of the methods.

In the foregoing detailed description, the method and apparatus of the present inventive subject matter have been described with reference to specific exemplary embodiments thereof. It will, however, be evident that various modifications and changes may be made thereto without departing from the broader spirit and scope of the present inventive subject matter. The present specification and figures are accordingly to be regarded as illustrative rather than restrictive.

What is claimed is:

1. A method comprising:
   receiving, by a co-packaged optical device, multimode light generated by one or more external laser assemblies, the multimode light received from a few-mode fiber coupled to the co-packaged optical device, the co-packaged optical device comprising a plurality of co-packaged optics modules including a direct detection transceiver module and a coherent transceiver module, the multimode light comprising a first mode of light generated by the one or more external laser assemblies for modulation by the direct detection transceiver module, the multimode light further comprising a second mode of light generated by the one or more external laser assemblies for modulation by the coherent transceiver module;
   separating, using a few-mode coupler of the co-packaged optical device, a first beam of light from the first mode and a second beam of light from the second mode;
   modulating the first beam of light using the direct detection transceiver module and modulating the second beam of light using the coherent transceiver module; and
   transmitting the first beam of light using the direct detection transceiver module and transmitting the second beam of light using the coherent transceiver module.

2. The method of claim 1, wherein the plurality of co-packaged optics modules further comprise an additional direct detection transceiver to modulate light generated by the one or more external laser assemblies.

3. The method of claim 1, wherein the plurality of co-packaged optics modules further comprise an additional coherent transceiver to modulate light generated by the one or more external laser assemblies.

4. The method of claim 3, wherein the coherent transceiver module is a quadrature amplitude modulation (QAM) transceiver and the plurality of co-packaged optics modules further comprise an additional QAM transceiver.

5. The method of claim 4, wherein the QAM optical transceiver and the additional QAM transceiver are configured to modulate and demodulate in different QAM formats.

6. The method of claim 3, wherein the coherent transceiver module is a phase shift keying (PSK) transceiver and the plurality of co-packaged optics modules further comprise an additional PSK transceiver, and wherein the PSK optical transceiver and the additional PSK transceiver are configured to operate in different PSK formats.

7. The method of claim 1, further comprising:
receiving, by the co-packaged optical device, a first received beam of light and a second received beam of light;
demodulating the first received beam of light using the direct detection transceiver module; and
demodulating the second received beam of light using the coherent transceiver module.

8. The method of claim 7, wherein the first received beam of light is received by the direct detection transceiver module, and wherein the second received beam of light is received by the coherent transceiver module.

9. The method of claim 1, wherein the direct detection transceiver module is a pulse amplitude modulation (PAM) optical transceiver.

10. The method of claim 9, wherein the plurality of co-packaged optics modules further comprise an additional PAM transceiver, wherein the PAM optical transceiver and the additional PAM transceiver operate in different PAM formats.

11. The method of claim 1, wherein the coupler is a spatial mode coupler that separates light based on different optical spatial modes.

12. The method of claim 1, further comprising: generating the multimode light using the one or more external laser assemblies.

13. The method of claim 1, wherein direct detection transceiver module and the coherent transceiver module are photonic integrated circuit (PIC) transceivers that are co-packaged with electrical circuitry.

14. The method of claim 13, wherein the co-packaged optical device comprises a switch Application-Specific Integrated Circuit (ASIC).

15. The method of claim 14, wherein the switch ASIC and the PIC transceivers are interconnected by an electrical interface.

16. The method of claim 1, wherein the one or more external laser assemblies include one or more of: a tunable light source or a fixed light source.

17. The method of claim 1, wherein the one or more external laser assemblies include one or more of: a distributed feedback laser, a quantum dot laser, an external cavity laser; and wherein the one or more external laser assemblies have different optical characteristics including one or more of linewidth, output power, or relative intensity noise.

18. A co-packaged optical device comprising:
a plurality of co-packaged optics modules that receive multimode light from a few-mode fiber that is coupled to the co-packaged optical device, the multimode light generated by one or more external laser assemblies, the plurality of co-packaged optics modules including a direct detection transceiver module and a coherent transceiver module, the multimode light comprising a first mode of light generated by the one or more external laser assemblies for modulation by the direct detection transceiver module, the multimode light further comprising a second mode of light generated by the one or more external laser assemblies for modulation by the coherent transceiver module; and
a coupler to separate a first beam of light from the first mode of the multimode light and separate a second beam of light from the second mode of the multimode light,
the direct detection transceiver to modulate and transmit the first beam of light and the coherent transceiver module to modulate and transmit the second beam of light.

19. The co-packaged optical device of claim 18, wherein the coupler is a spatial mode coupler that separates light based on different optical spatial modes.

20. The co-packaged optical device of claim 18, wherein the one or more external laser assemblies include one or more of: a tunable light source or a fixed light source.

* * * * *